United States Patent
Fuchida et al.

(10) Patent No.: US 11,128,102 B2
(45) Date of Patent: Sep. 21, 2021

(54) SEMICONDUCTOR OPTICAL DEVICE

(71) Applicant: Mitsubishi Electric Corporation, Tokyo (JP)

(72) Inventors: Ayumi Fuchida, Tokyo (JP); Go Sakaino, Tokyo (JP); Tetsuya Uetsuji, Tokyo (JP); Naoki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/498,357

(22) PCT Filed: Sep. 7, 2017

(86) PCT No.: PCT/JP2017/032295
§ 371 (c)(1),
(2) Date: Sep. 26, 2019

(87) PCT Pub. No.: WO2019/049268
PCT Pub. Date: Mar. 14, 2019

(65) Prior Publication Data
US 2021/0036485 A1     Feb. 4, 2021

(51) Int. Cl.
*H01S 5/026*     (2006.01)
*G02B 6/12*      (2006.01)
(Continued)

(52) U.S. Cl.
CPC .......... *H01S 5/026* (2013.01); *G02B 6/12004* (2013.01); *H01S 5/06258* (2013.01); *H01S 5/12* (2013.01); *G02B 2006/12121* (2013.01)

(58) Field of Classification Search
CPC ........ H01S 5/026; H01S 5/12; H01S 5/06258; G02B 6/12004; G02B 2006/12121; G02B 6/122
See application file for complete search history.

(56) References Cited

U.S. PATENT DOCUMENTS

2008/0219315 A1*  9/2008  Makino ............... H01S 5/0265
                                                     372/50.1
2011/0292960 A1* 12/2011  Shoji ................. H01S 5/06256
                                                    372/50.11

FOREIGN PATENT DOCUMENTS

JP      H02-271583 A     11/1990
JP      H07-307523 A     11/1995
(Continued)

OTHER PUBLICATIONS

International Search Report; Written Opinion; and Notification of Transmittal of the International Search Report and the Written Opinion of the International Searching Authority, or the Declaration issued in PCT/JP2017/032295; dated Nov. 14, 2017.
(Continued)

*Primary Examiner* — Xinning(Tom) Niu
(74) *Attorney, Agent, or Firm* — Studebaker & Brackett PC

(57) ABSTRACT

A semiconductor optical device is provided with a semiconductor substrate that has a length and width, a laser section that is provided on the semiconductor substrate and includes an active layer and an optical waveguide section that is provided adjacent to the laser section on the semiconductor substrate and is joined to the laser section. The optical waveguide section includes a core layer that is connected to an end portion of the active layer, and a pair of cladding layers between which the core layer is sandwiched and emits, from an emission end surface, light incident from the joining interface between the optical waveguide section and the laser section. The semiconductor optical device may be also provided with a reflection suppression layer that is provided on the upper surface of the optical waveguide section.

10 Claims, 7 Drawing Sheets

C-C SECTION

(51) Int. Cl.
*H01S 5/0625* (2006.01)
*H01S 5/12* (2021.01)

(56) References Cited

FOREIGN PATENT DOCUMENTS

| | | |
|---|---|---|
| JP | H11-154770 A | 6/1999 |
| JP | 2003-234533 A | 8/2003 |

OTHER PUBLICATIONS

An Office Action mailed by China National Intellectual Property Administration on Dec. 30, 2020, which corresponds to Chinese Patent Application No. 201780094518.8 and is related to U.S. Appl. No. 16/498,357 with English language translation.

* cited by examiner

C-C SECTION

B-B SECTION

C-C SECTION

SEMICONDUCTOR OPTICAL DEVICE

FIELD

The present application relates to a semiconductor optical device.

BACKGROUND

Semiconductor optical devices with a light absorption layer provided on a cladding layer are conventionally known as described, for example, in JP H2-271583 A. Such a semiconductor optical device is provided with a laser section having an active layer and an optical waveguide section that guides the laser light generated by the laser section. The optical waveguide section includes a core layer joined to the active layer, and an upper cladding layer and a lower cladding layer between which the core layer is sandwiched. In this conventional semiconductor optical device, a light absorption layer is laminated on at least one of the upper cladding layer and the lower cladding layer parallel to the core layer. The light absorption layer has a band gap equivalent to the band gap of the active layer or narrower than the band gap of the active layer.

CITATION LIST

Patent Literature

PTL 1: JP 112-271583 A

SUMMARY

Technical Problem

When scattered light is generated at a joining interface between the active layer and the core layer, this scattered light propagates through the upper cladding layer and the lower cladding layer. When the scattered light is guided through the optical waveguide section while being reflected by a top surface of the upper cladding layer and an undersurface of the lower cladding layer, the scattered light may be transmitted from an emission facet of the semiconductor optical device to an optical fiber. Such scattered light becomes optical noise and the optical noise degrades signal quality.

In this respect, the conventional semiconductor optical integrated device is provided with the light absorption layer on the upper cladding layer or the lower cladding layer over an overall length of the optical waveguide section. The scattered light can be absorbed at the interface between the light absorption layer and the upper cladding layer or at the interface between the light absorption layer and the lower cladding layer. The optical noise can be suppressed in this way. Note that one end of the optical waveguide section constitutes a butt joint interface with the laser section. The other end of the optical waveguide section constitutes an emission facet of the semiconductor optical device. The overall length of the optical waveguide section corresponds to a length from the butt joint interface to the emission facet.

When the light absorption layer is provided over the overall length of the optical waveguide section, the light absorption layer absorbs part of necessary signal light seeping out of the core layer. When a signal light intensity is weakened due to light absorption, optical output may decrease or an operation current may increase. As a result, there is a problem that electrooptic characteristics of the semiconductor optical device deteriorate.

It is an object of the present application to provide a semiconductor optical device improved such a way as to make suppression of optical noise and good electrooptic characteristics compatible.

Solution to Problem

A semiconductor optical device according to one aspect of present disclosure includes:

a semiconductor substrate that has a length and width;

a laser section that is provided on the semiconductor substrate and comprises an active layer;

an optical waveguide section comprising a lower cladding layer laminated on the semiconductor substrate, a core layer laminated on the lower cladding layer and connected to an end portion of the active layer and an upper cladding layer laminated on the core layer, the optical waveguide section being provided on the semiconductor substrate adjacent to the laser section in the length direction; and a reflection suppression layer that is provided either on a top surface of the upper cladding layer or above the core layer in the upper cladding layer, has a length shorter than an overall length of the optical waveguide section and is positioned at a center of the optical waveguide section in the length direction.

Advantageous Effects of Invention

According to the above-described semiconductor optical device, since the reflection suppression layer for optical noise suppression is formed to be shorter than the overall length of the optical waveguide section, it is possible to suppress weakening of the signal light intensity. It is thereby possible to make optical noise suppression and good electrooptic characteristics compatible.

DESCRIPTION OF EMBODIMENTS

Embodiment 1.

Figure 1:
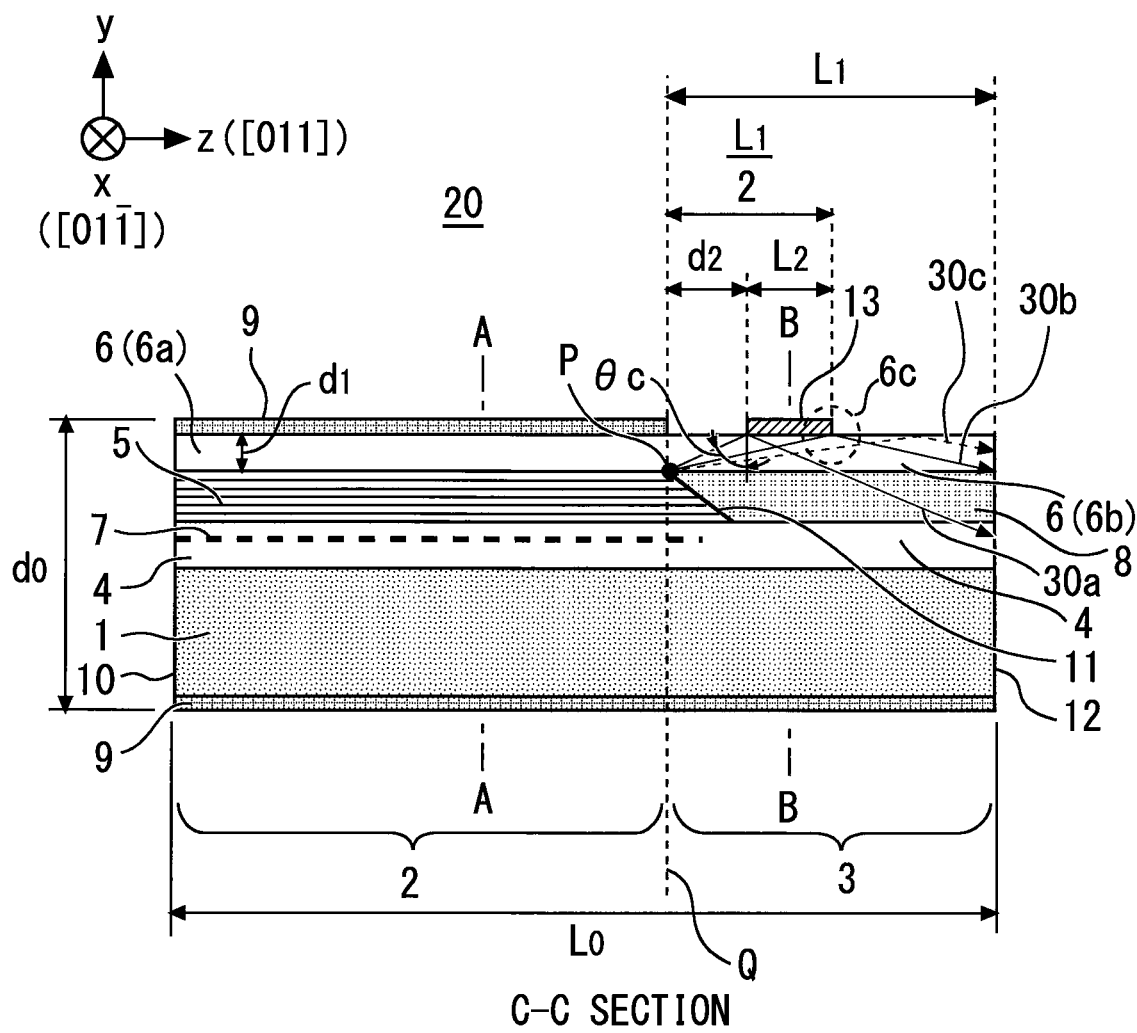
FIG. 1 is a cross-sectional view illustrating a semiconductor optical device according to Embodiment 1 of the present invention.
Figure 2:
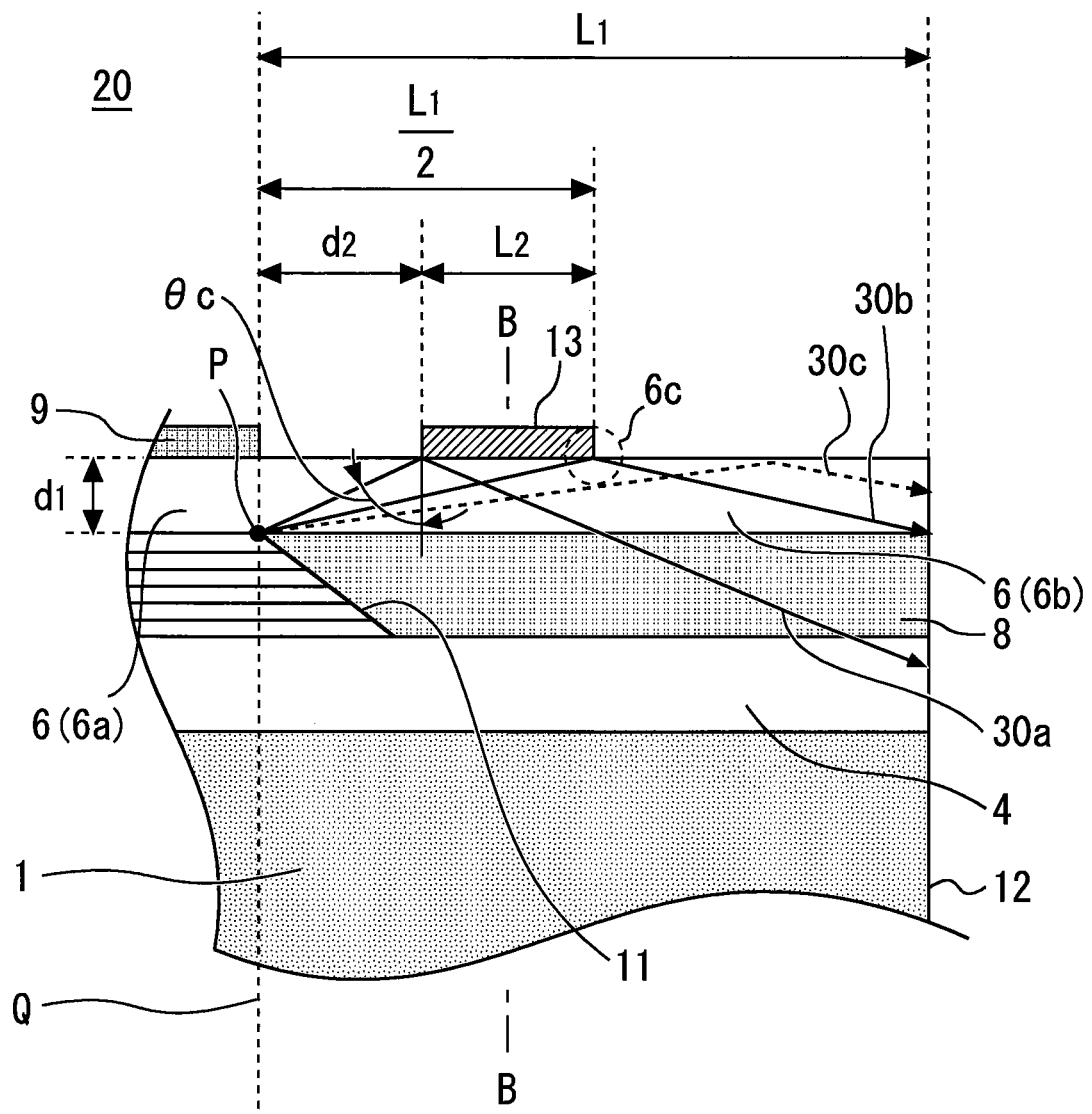
FIG. 2 is an enlarged cross-sectional view illustrating a semiconductor optical device according to Embodiment 1 of the present invention.
Figure 3:
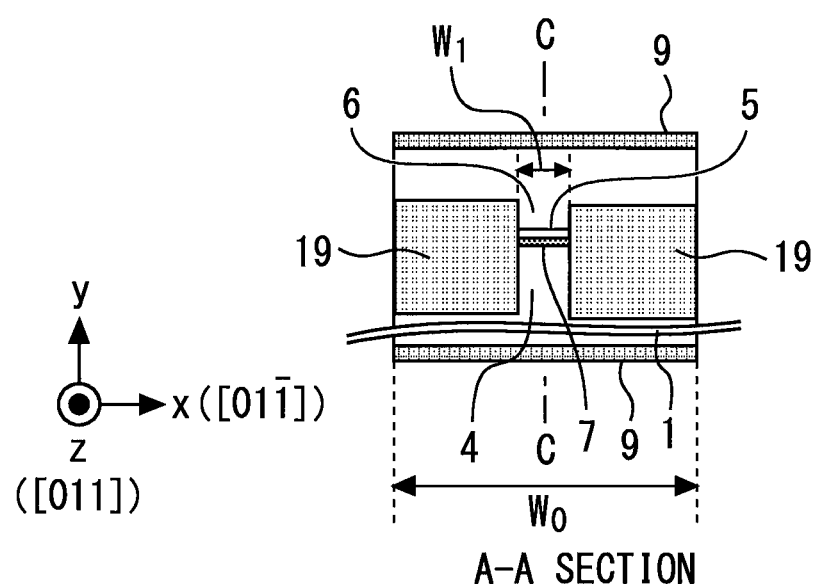
FIG. 3 is a cross-sectional view illustrating a semiconductor optical device according to Embodiment 1 of the present invention.
Figure 4:
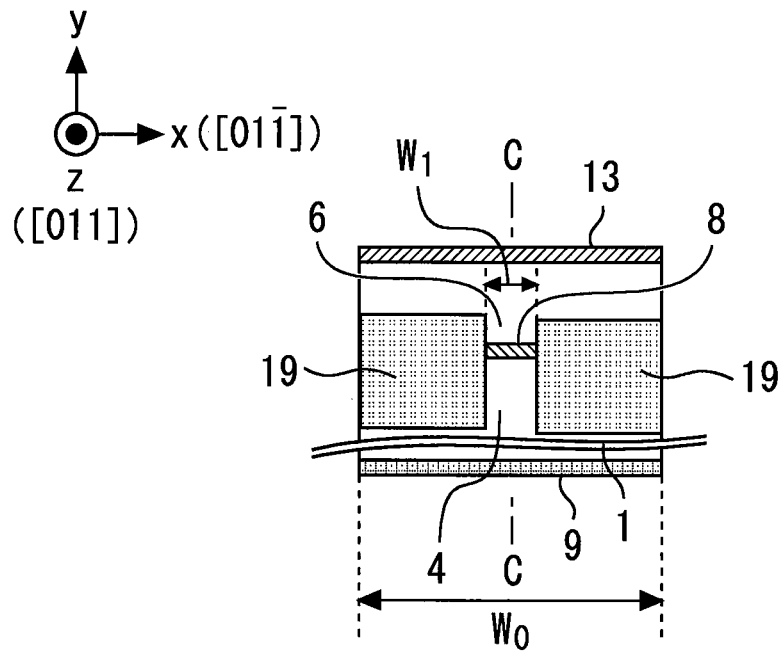
FIG. 4 is a cross-sectional view illustrating a semiconductor optical device according to Embodiment 1 of the present invention.

FIG. 1 to FIG. 4 are cross-sectional views illustrating a semiconductor optical device 20 according to Embodiment 1 of the present invention. FIG. 2 is a partially enlarged view of FIG. 1. FIG. 3 is a cross section of the semiconductor optical device 20 along a line A-A in FIG. 1. FIG. 4 is a cross section of the semiconductor optical device 20 along a line B-B in FIG. 1. FIG. 1 is a cross section of the semiconductor optical device 20 along a line C-C in FIG. 3 and FIG. 4. FIG. 1 to FIG. 4 illustrate xyz orthogonal coordinate axes defining a length direction, a width direction x, and a thickness direction y.

As shown in FIG. 1, the semiconductor optical device 20 is provided with a semiconductor substrate 1, a laser section 2, an optical waveguide section 3 and a first reflection suppression layer 13. The laser section 2 and the optical waveguide section 3 are laminated on the semiconductor substrate 1 by means of butt joint. A rear facet 10 is provided at a rear end portion of the semiconductor optical device 20 and an emission facet 12 is provided at a front-end portion of the semiconductor optical device 20.

As shown in FIG. 1, the semiconductor substrate 1 has a length $L_0$. As shown in FIG. 2 and FIG. 3, the semiconductor substrate 1 has a width $W_0$. The semiconductor substrate 1 is an InP substrate having a (100) plane as a principal plane. A direction is assumed to be a "length direction" and this is assumed to be a z-direction.

A direction is assumed to be an "axial direction" and this is assumed to be an x-direction.

A direction perpendicular to both the z-axis and the x-axis, that is, an upward direction of the sheet surface in FIG. 1 is assumed to be a "thickness direction" and this is assumed to be the y-direction. The "length direction" coincides with a "resonator direction" of the laser section 2. The semiconductor substrate 1 is doped p-type or n-type.

The laser section 2 is provided on the semiconductor substrate 1. The laser section 2 is constructed of a lower cladding layer 4, a diffraction grating 7, an active layer 5 and an upper cladding layer 6 which are laminated in this order on the semiconductor substrate 1. The lower cladding layer 4 and the upper cladding layer 6 are made of InP. The active layer 5 is made of an InGaAsP-based or AlGaInAs-based semiconductor. The diffraction grating 7 is made of an InGaAsP-based semiconductor. The diffraction grating 7 may be provided in the lower cladding layer 4 or in the upper cladding layer 6. The active layer 5 may include a quantum well structure. When the semiconductor substrate 1 is doped p-type, the lower cladding layer 4 is doped p-type and the upper cladding layer 6 is doped n-type. On the other hand, when the semiconductor substrate 1 is doped n-type, the lower cladding layer 4 is doped n-type and the upper cladding layer 6 is doped p-type.

The optical waveguide section 3 is provided adjacent to the laser section 2 on the semiconductor substrate 1 and butt joined to the laser section 2. The optical waveguide section 3 is provided with the lower cladding layer 4 provided on the semiconductor substrate 1, a core layer 8 provided on the lower cladding layer 4 and the upper cladding layer 6 provided on the core layer 8. Laser light from the laser section 2 is incident on the optical waveguide section 3.

FIG. 1 illustrates a virtual boundary line Q that partitions the laser section 2 from the optical waveguide section 3. In Embodiment 1, the upper cladding layer 6 is one layer laminated on both the active layer 5 and the core layer 8, and is an InP layer having the same material and the same thickness $d_1$ across the virtual boundary line Q. However, the upper cladding layer 6 can be divided into a portion included in the laser section 2 and a portion included in the optical waveguide section 3. In the embodiment, the portion included in the laser section 2 of the upper cladding layer 6 is, for distinguishing from each other, also referred to as a "first upper cladding layer 6a" and the portion included in the optical waveguide section 3 of the upper cladding layer 6 is also referred to as a "second upper cladding layer 6b". The first upper cladding layer 6a is laminated on the active layer 5, whereas the second upper cladding layer 6b is laminated on the core layer 8.

The core layer 8 is sandwiched between the lower cladding layer 4 and the second upper cladding layer 6b. An end portion of the core layer 8 is connected to an end portion of the active layer 5. The active layer 5 and the core layer 8 are joined together at a butt joint interface 11. The optical waveguide section 3 is provided with the emission facet 12 on the front. Laser light is emitted from the emission facet 12.

The optical waveguide section 3 has an overall length $L_1$ in the length direction. The overall length $L_1$ is a length from the virtual boundary line Q to the emission facet 12. The virtual boundary line Q is a line that passes through an intersection P and perpendicular to the surface of the semiconductor substrate 1 in a cross-sectional view in FIG. 1. In Embodiment 1, the intersection P is used as an origin to measure the overall length $L_1$ of the optical waveguide section 3. In the cross-sectional view in FIG. 1, the intersection P is a top end of the butt joint interface 11. At the intersection P, the butt joint interface 11 and the upper cladding layer 6 cross each other. In Embodiment 1, the laser section 2 is assumed to be partitioned from the optical waveguide section 3 with the top end of the butt joint interface 11 as a boundary.

The core layer 8 is made of an InGaAsP-based semiconductor or an AlGaInAs-based semiconductor. The core layer 8 may also include a quantum well structure. An electrode 9 is provided on each of the undersurface of the semiconductor substrate 1 and the top surface of the first upper cladding layer 6a. The electrode 9 is formed of one metal material selected from a metal group of Au, Ge, Zn, Pt and Ti or the like or a metal material obtained by combining a plurality of metals from this metal group.

The butt joint interface 11 may be a (111) plane formed by anisotropic wet etching or a dry-etched plane.

In Embodiment 1, the butt joint interface 11 is inclined with respect to the surface of the semiconductor substrate 1 in the cross-sectional view in FIG. 1. Depending on the specification of the semiconductor optical device 20, the thickness of the active layer 5 and the core layer 8 may be sufficiently smaller than the thickness of the upper cladding layer 6 and the lower cladding layer 4. In this case, the butt joint interface 11 is sufficiently short with respect to the outside shape of the semiconductor optical device 20. When the butt joint interface 11 is sufficiently short with respect to the overall length $L_1$ of the optical waveguide section 3, the butt joint interface 11 can be regarded substantially as a single origin, and so the inclination of the butt joint interface 11 need not be considered. Note that since the butt joint process is carried out by dry etching or the like, there can also be a case where the butt joint interface 11 is perpendicular to the surface of the semiconductor substrate 1. In this case, since the butt joint interface 11 is perpendicular to the surface of the semiconductor substrate 1, the length $L_1$ from the position of the butt joint interface 11 to the emission facet 12 is determined uniquely.

The first reflection suppression layer 13 is provided on part of the top surface of the optical waveguide section 3, that is, part of the top surface of the second upper cladding layer 6b. A length $L_2$ of the first reflection suppression layer 13 is shorter than the overall length $L_1$ of the optical waveguide section 3. The first reflection suppression layer 13 is positioned on the central part 6c of the top surface of the second upper cladding layer 6b. The central part 6c is located at the center of the second upper cladding layer 6b in the length direction, that is, at the center of the optical waveguide section 3 in the length direction. The central part 6c is located at a position advanced by $L_1/2$ from the virtual boundary line Q in the length direction. The first reflection suppression layer 13 can prevent the scattered light from being reflected at the central part 6c on the top surface of the second upper cladding layer 6b.

The first reflection suppression layer 13 is provided with one end provided on the laser section 2 side in the length direction and the other end provided opposite to the one end. The length $L_2$ of the first reflection suppression layer 13 is a length from the one end to the other end. The one end of the first reflection suppression layer 13 is a predetermined distance $d_2$ away from the virtual boundary line Q. No first reflection suppression layer 13 is provided within the predetermined distance $d_2$.

The other end of the first reflection suppression layer 13 is terminated at the central part 6c of the second upper cladding layer 6b. FIG. 1 and FIG. 2 also illustrate a central position $L_1/2$. The central position $L_1/2$ corresponds to a position half the overall length $L_1$ of the optical waveguide section 3 in the length direction. Since the optical waveguide section 3 and the second upper cladding layer 6b have the same length in the length direction, the central position $L_1/2$ also corresponds to the position half the second upper cladding layer 6b. The other end of the first reflection suppression layer 13 in the length direction is located just at the central position $L_1/2$. As a result, the first reflection suppression layer 13 is not provided in a region from the central position $L_1/2$ to the emission facet 12.

The first reflection suppression layer 13 is a light absorption layer. The material constituting the first reflection suppression layer 13 has a band gap equal to or smaller than the band gap of the active layer 5. The first reflection suppression layer 13 can absorb the scattered light that reaches the interface between the second upper cladding layer 6b and the first reflection suppression layer 13. The first reflection suppression layer 13 may also be formed by causing a semiconductor layer to grow epitaxially on the top surface of the second upper cladding layer 6b. The first reflection suppression layer 13 may also be formed of a semiconductor material having a narrower band gap than an InGaAsP-based semiconductor or an AlGaInAs-based semiconductor constituting the active layer 5. For example, InGaAs or the like may be used as the material of the first reflection suppression layer 13. The first reflection suppression layer 13 may also be formed by increasing a carrier concentration of the semiconductor. The first reflection suppression layer 13 may also be formed by causing a metal including Zn or the like to spread in the semiconductor.

As shown in FIG. 3 and FIG. 4, the semiconductor optical device 20 is provided with buried layers 19. The buried layers 19 are provided on both sides of the active layer 5 and on both sides of the core layer 8. The buried layers 19 are made of a semi-insulating material, and more specifically, made of InP doped with Fe, Ru or the like. Current constriction can be performed when the buried layers 19 form a burying structure. Current can be injected efficiently into the active layer 5 in this way.

The width $W_1$ of the active layer 5 and the core layer 8 is preferably 0.8 μm to 1.6 μm, but may be outside this range. When current is injected from the electrode 9, laser light is generated in the active layer 5. The rear facet 10 and the diffraction grating 7 form a resonator of the laser section 2. The laser light generated at the laser section 2 passes through the butt joint interface 11 and is coupled to the core layer 8. After that, the laser light is emitted from the emission facet 12 as signal light.

At the butt joint interface 11, differences are generated in the equivalent refractive index and the film thickness between the active layer 5 and the core layer 8. When the laser light from the laser section 2 is coupled to the optical waveguide section 3, scattered light is generated. The scattered light spreads in a direction from the core layer 8 toward the second upper cladding layer 6b and in a direction from the core layer 8 toward the semiconductor substrate 1. Part of the scattered light spreading from the core layer 8 toward the second upper cladding layer 6b side is reflected by the top surface of the second upper cladding layer 6b. When this reflected light is emitted from the vicinity of the core layer 8 at the emission facet 12, the reflected light is coupled to an optical fiber (not shown). As a result, optical noise may be generated.

The semiconductor optical device 20 has a chip thickness $d_0$. The chip thickness $d_0$ is a thickness from the top surface of the upper cladding layer 6 to the undersurface of the semiconductor substrate 1. The chip thickness $d_0$ is on the order of 80 μm to 110 μm. The cross-sectional views in FIG. 1 to FIG. 4 are schematic views and the actual active layer 5 and core layer 8 are located from the top surface of the upper cladding layer 6 toward the semiconductor substrate 1 at a depth on the order of 2 μm to 6 μm. That is, the active layer 5 and the core layer 8 are biased toward the top surface side of the upper cladding layer 6 in the chip thickness of the semiconductor optical device 20. The scattered light spreading from the core layer 8 toward the semiconductor substrate 1 travels away from the core layer 8. Since such scattered light is hardly coupled to the optical fiber (not shown), influences on the signal light are small.

Figure 5:
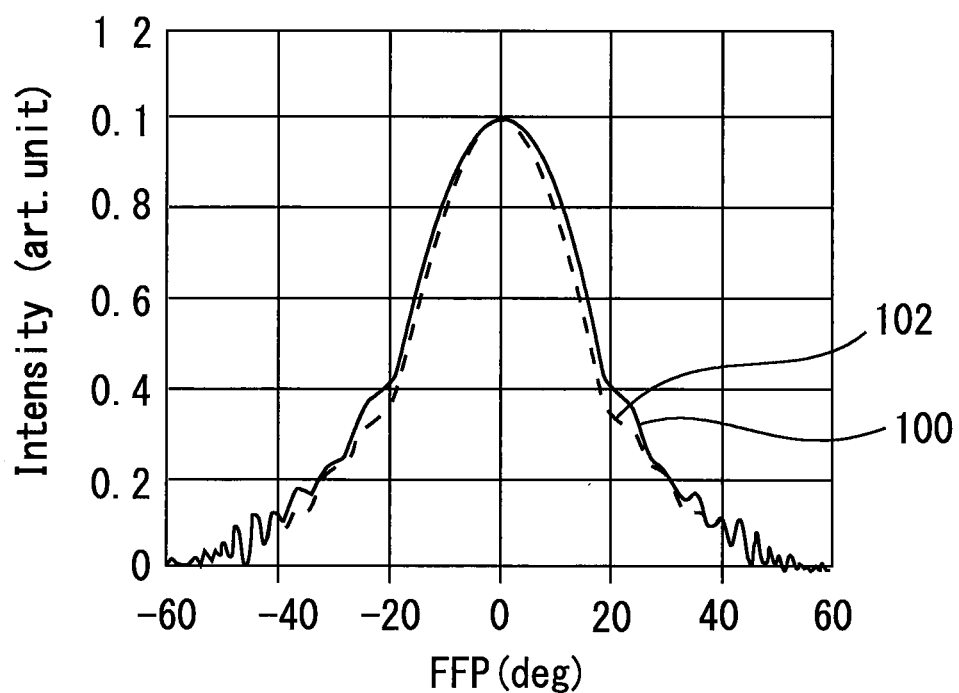
FIG. 5 is a graph illustrating operation of the semiconductor optical device according to Embodiment 1 of the present invention.
Figure 6:
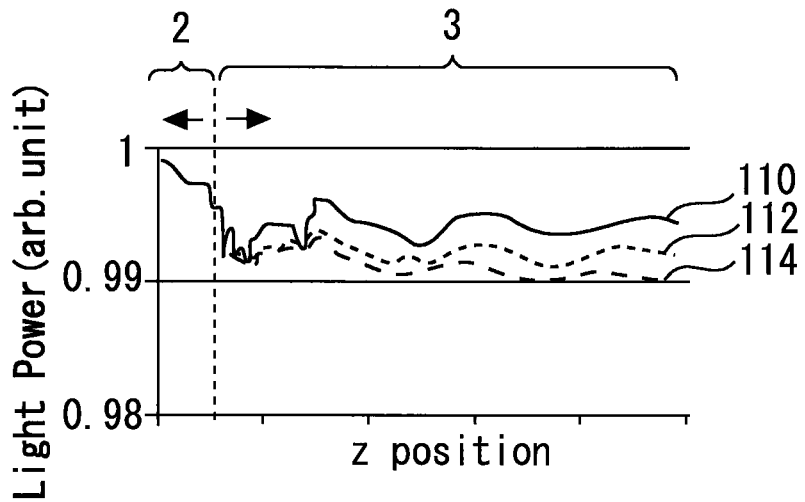
FIG. 6 is a graph illustrating operation of the semiconductor optical device according to Embodiment 1 of the present invention.

FIG. 5 and FIG. 6 are graphs illustrating operation of the semiconductor optical device 20 according to Embodiment 1 of the present invention. FIG. 5 compares FFP shapes derived from calculations. FIG. 5 shows far-field patterns (FFP) emitted from a position 40 μm away from the butt joint interface 11 derived from calculations. A characteristic 100 shown by a solid line in FIG. 5 illustrates an FFP shape with a structure corresponding to Embodiment 1. A comparative example characteristic 102 shown by a broken line in FIG. 5 illustrates an FFP shape with a structure obtained by removing the first reflection suppression layer 13 from Embodiment 1.

According to the characteristic 100, it is assumed that one end of the first reflection suppression layer 13 is provided at a position 2 μm away from the butt joint interface 11. That is, a predetermined distance $d_2$=2 μm. According to the characteristic 100, it is assumed that the other end of the first reflection suppression layer 13 extends to a position 18 μm away from the butt joint interface 11. In this case, the distance from the one end to the other end of the first reflection suppression layer 13, that is, the length $L_2$ is "18 μm−2 μm=16 μm". An lasing wavelength is 1.31 μm. The thickness of the upper cladding layer 6 is 1.9 μm. The thickness of the first reflection suppression layer 13 is 0.4

µm. A refractive index m of InP constituting the first reflection suppression layer 13 is as follows.

$$m=3.17-0.1i$$

According to the comparative example characteristic 102, since no first reflection suppression layer 13 is provided, slight backlash is observed on the skirts of the beam shape due to scattered light. In contrast, according to the characteristic 100 corresponding to Embodiment 1, scattered light is absorbed, so there is less FFP backlash. The characteristic 100 has a shape similar to a Gaussian beam. The characteristic 100 can be further approximated to a Gaussian beam by increasing the length $L_1/2$ of the first reflection suppression layer 13 or increasing an absorption coefficient of the first reflection suppression layer 13.

FIG. 6 is a graph illustrating a relationship between a z position indicating each position in the length direction and optical output for each z position. A characteristic curve 112 corresponding to Embodiment 1 is illustrated. The structure of the first reflection suppression layer 13 is similar to the calculation conditions in FIG. 5. Furthermore, a first comparative example characteristic curve 110 and a second comparative example characteristic curve 114 are illustrated. The first comparative example characteristic curve 110 is a characteristic when no first reflection suppression layer 13 is provided. The second comparative example characteristic curve 114 is a characteristic when the first reflection suppression layer 13 is provided over the overall length of the optical waveguide section 3. FIG. 6 illustrates respective characteristic curves of the laser section 2 and the optical waveguide section 3 across the virtual boundary line Q.

As shown in FIG. 6, optical output decreases due to scattering of light at the butt joint interface 11 in all the characteristic curves. According to the first comparative example characteristic curve 110, since no first reflection suppression layer 13 is provided, there is no light loss at the butt joint interface 11 other than light loss caused by scattering. Therefore, the first comparative example characteristic curve 110 is a characteristic curve having the highest light intensity in FIG. 6. However, the first comparative example characteristic curve 110 includes large FFP backlash as shown in FIG. 5. Regarding the second comparative example characteristic curve 114, since the first reflection suppression layer 13 is provided over the overall length of the optical waveguide section 3, part of necessary signal light is absorbed by the first reflection suppression layer 13. As a result, optical output decreases as the propagation distance of the optical waveguide section 3 increases with an increase in the z position. Therefore, the first comparative example characteristic curve 110 corresponds to a characteristic curve having the lowest light intensity in FIG. 6. The characteristic curve 112 corresponding to Embodiment 1 exhibits intermediate performance between the first comparative example characteristic curve 110 and the second comparative example characteristic curve 114. Propagate loss can be reduced by shortening the length of the first reflection suppression layer 13 or lowering the absorption coefficient. However, trade-off with an improvement in the FFP shape needs to be considered.

The predetermined distance $d_2$ will be described with reference to a first light beam 30a to a third light beam 30c in FIG. 2. Parts of scattered light started in the vicinity of the butt joint interface 11 are represented by a first light beam 30a to a third light beam 30c. The angle of incidence with respect to the top surface of the second upper cladding layer 6b is the smallest for the first light beam 30a, and then increases in order of the second light beam 30b and the third light beam 30c. The first light beam 30a to the third light beam 30c propagate through the second upper cladding layer 6b and is reflected by the top surface of the second upper cladding layer 6b. The first light beam 30a to the third light beam 30c reflected by the top surface reach the emission facet 12.

When the scattered light reaches the vicinity of the core layer 8 on the emission facet 12, the scattered light becomes optical noise by being transmitted to the optical fiber (not shown). When the optical noise is generated, signal quality is degraded. For example, light reaching the top surface of the second upper cladding layer 6b right above the butt joint interface 11 or in the vicinity thereof has an angle of incidence smaller than the angle of incidence of the first light beam 30a. Since the angle of incidence of such light never becomes a total reflection critical angle, the light is never totally reflected by the top surface of the second upper cladding layer 6b. For this reason, even if the first reflection suppression layer 13 is not provided nearest to the butt joint interface 11, there is little influence on the signal quality. Therefore, the predetermined distance $d_2$ is provided between the butt joint interface 11 and one end of the first reflection suppression layer 13 in Embodiment 1. It is thereby possible to form the first reflection suppression layer 13 only in a region that greatly contributes to optical noise measures and make suppression of optical noise and securing of signal light intensity compatible.

A preferable size of the predetermined distance $d_2$ will be described with reference to FIG. 2. The thickness of the upper cladding layer 6 is assumed to be $d_1$. The thickness $d_1$ is a distance from the top end of the active layer 5 and the top end of the core layer 8 to the top surface of the upper cladding layer 6 in the cross-sectional view in FIG. 1 and FIG. 2. The total reflection critical angle of the upper cladding layer 6 is assumed to be $\theta_C$. $\theta_C$ is a critical angle at which the scattered light generated at the butt joint interface 11 is totally reflected by the top surface of the second upper cladding layer 6b. At this time, the predetermined distance $d_2$ preferably satisfies the following inequality expression.

$$d_2 \leq d_1 \times \tan \theta_C$$

where when the material of the upper cladding layer 6 is InP, $\theta_C=18°$. A refractive index of InP is 3.17.

The reason that the above-described inequality expression is preferably satisfied will be described with reference to the first light beam 30a in FIG. 2. The first light beam 30a reaches a region of the second upper cladding layer 6b at a distance of "$d_1 \times \tan \theta_C$" from the butt joint interface 11. Since the angle of incidence of the first light beam 30a coincides with the total reflection critical angle $\theta_C$, the first light beam 30a is totally reflected by the top surface of the second upper cladding layer 6b. When the predetermined distance $d_2$ is set to be greater than $d_1 \times \tan \theta_C$, a region where total reflection of scattered light cannot be suppressed is generated between the butt joint interface 11 and the central part 6c. By setting the predetermined distance $d_2$ to be equal to or less than $d_1 \times \tan \theta_C$, it is possible to suppress total reflection of scattered light within a range between the butt joint interface 11 and the central part 6c. It is thereby possible to form the first reflection suppression layer 13 only in the region that greatly contributes to optical noise measures, and thereby make suppression of optical noise and suppression of excessive absorption of signal light compatible.

A position preferable to terminate the other end of the first reflection suppression layer 13 will be described with reference to FIG. 2. When the second light beam 30b reaches the central part 6c on the top surface of the second upper cladding layer 6b, it is totally reflected. Since the angle of incidence is equal to the reflection angle, the second light beam 30b reaches a point nearest to the core layer 8 on the emission facet 12. The third light beam 30c reaches a point closer to the emission facet 12 side than the central part 6c in the second upper cladding layer 6b and is totally reflected. Since the angle of incidence is equal to the reflection angle, the third light beam 30c reaches the facet of the second upper cladding layer 6b included in the emission facet 12. To secure the optical noise suppression effect, it is sufficient to take measures up to the second light beam 30b and even when the third light beam 30c is ignored, the influence is small. Therefore, the other end of the first reflection suppression layer 13 is terminated at the central position $L_1/2$ to suppress reflection up to the second light beam 30b as a limit. Thus, the first reflection suppression layer 13 can be formed only in the region that greatly contributes to the optical noise measures, and so it is possible to make optical noise suppression and excessive suppression of signal light compatible.

According to the semiconductor optical device 20 of Embodiment 1, it is possible to prevent scattered light from being reflected by the first reflection suppression layer 13 toward the emission facet 12, and thereby reduce outputted optical noise from the optical waveguide section 3. Since the length $L_2$ of the first reflection suppression layer 13 is shorter than the overall length $L_1$ of the optical waveguide section 3, it is possible to suppress weakening of signal light intensity. It is thereby possible to make optical noise suppression and good electrooptic characteristics compatible. That is, in Embodiment 1, laser light generated in the active layer 5 is coupled to the core layer 8 of the optical waveguide section 3 and emitted from the emission facet 12. At this time, scattered light generated at the butt joint interface 11 is absorbed in the first reflection suppression layer 13. Since the scattered light is absorbed, scattered light emitted from the emission facet 12 can be reduced. It is thereby possible to prevent optical noise from being coupled to the optical fiber (not shown).

Figure 9:
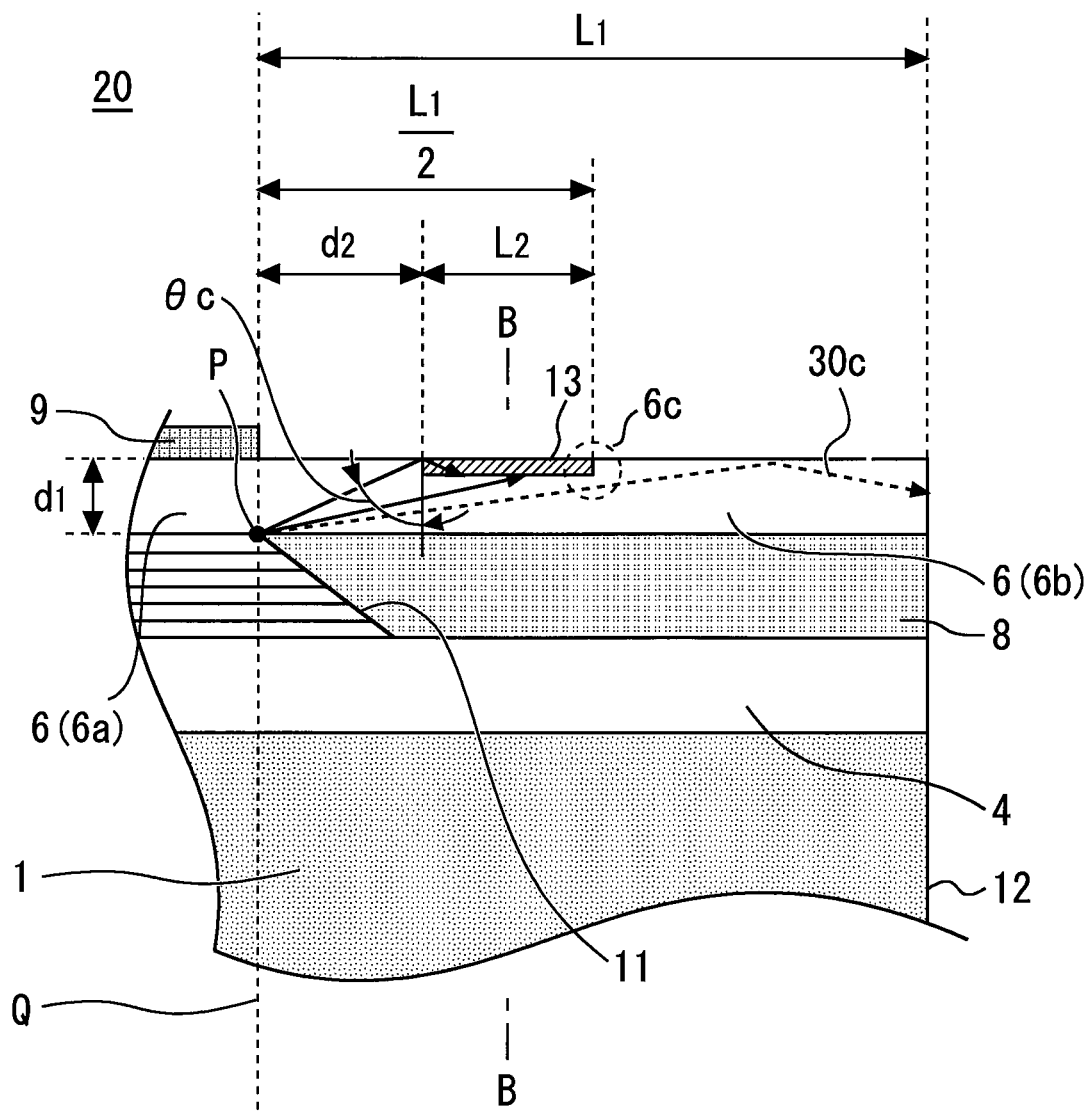
FIG. 9 is a cross-sectional view illustrating a semiconductor optical device according to a modification of Embodiment 1 of the present invention.

Modifications of Embodiment 1 will be described. FIG. 9 is a cross-sectional view illustrating the semiconductor optical device 20 according to a modification of Embodiment 1 of the present invention. In FIG. 1, the first reflection suppression layer 13 is provided on the top surface of the second upper cladding layer 6b, whereas the first reflection suppression layer 13 may be provided above the core layer 8 in the second upper cladding layer 6b as a first modification. As the first modification, two specific examples can be further presented. As a first specific example of the first modification, as shown in FIG. 9, the first reflection suppression layer 13 may be buried in the top surface part of the second upper cladding layer 6b. Furthermore, as a second specific example of the first modification, the first reflection suppression layer 13 may be buried in the interior of the second upper cladding layer 6b by further modifying the structure in FIG. 9. That is, the first reflection suppression layer 13 may be completely buried in a region at a certain depth from the top surface of the second upper cladding layer 6b.

As a second modification, the predetermined distance $d_2$ may be set to 0. Even when the predetermined distance $d_2$ is 0, the other end of the first reflection suppression layer 13 can be shorter than the optical waveguide section 3 on the emission facet 12 side. As a third modification, the other end of the first reflection suppression layer 13 may protrude from the central position $L_1/2$ in the length direction toward the emission facet 12 side. Alternatively, the other end of the first reflection suppression layer 13 may extend to the emission facet 12. Even when the other end of the first reflection suppression layer 13 reaches the emission facet 12, the length $L_2$ of the first reflection suppression layer 13 may be made shorter than the overall length $L_1$ of the optical waveguide section 3 by setting the predetermined distance $d_2$ to be greater than 0.

In Embodiment 1, the buried layers 19 are provided as the current constriction structure. As a fourth modification, instead of the buried layers 19, a publicly known current block buried layer may be used or a publicly known ridge structure may be used. The current block buried layer is a thyristor structure made of p-type InP and n-type InP. The ridge structure is a structure in which current constriction is performed by providing a ridge section above the active layer 5.

Embodiment 2.

Figure 7:
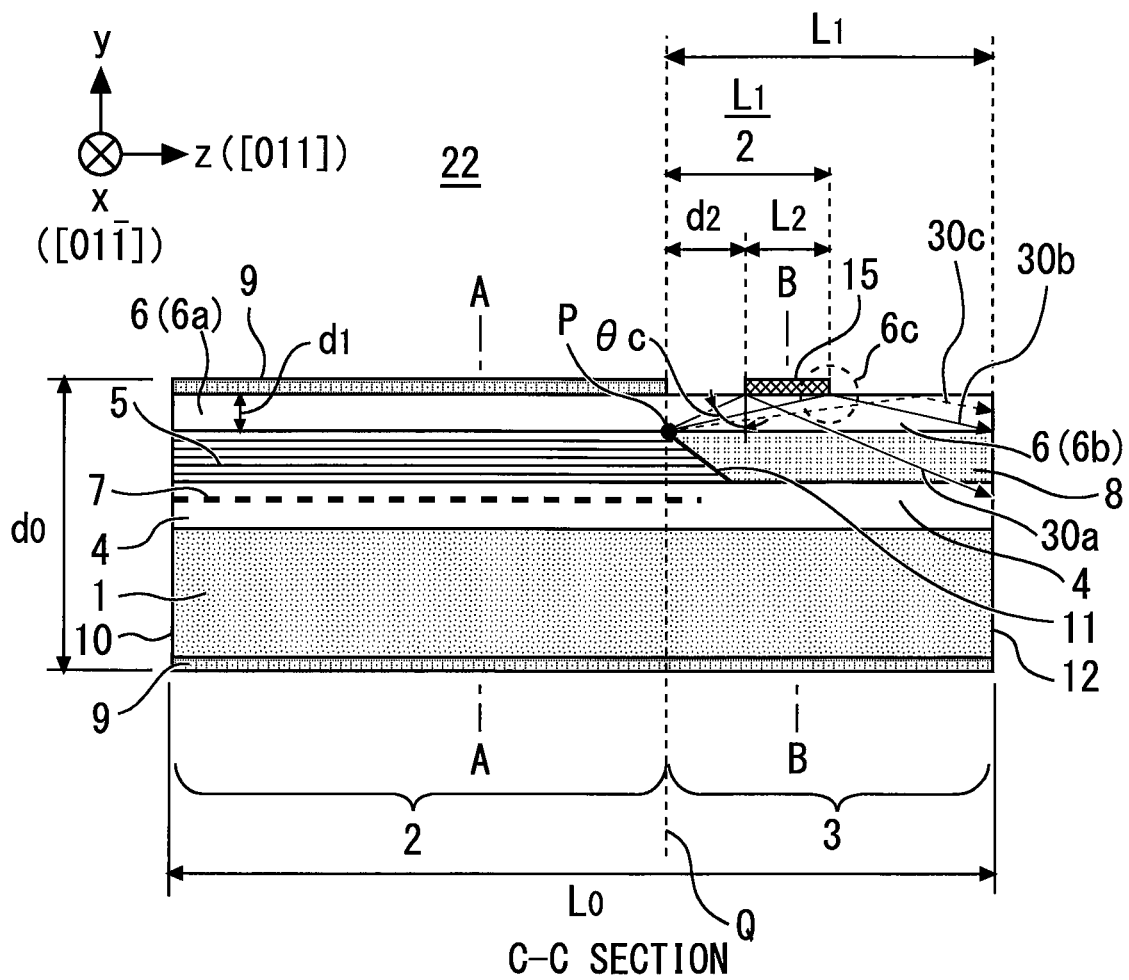
FIG. 7 is a cross-sectional view illustrating a semiconductor optical device according to Embodiment 2 of the present invention.

FIG. 7 is a cross-sectional view illustrating a semiconductor optical device 22 according to Embodiment 2 of the present invention. The semiconductor optical device 22 according to Embodiment 2 is obtained by replacing the first reflection suppression layer 13 of Embodiment 1 by a second reflection suppression layer 15. The second reflection suppression layer 15 according to Embodiment 2 is an antireflection film. The second reflection suppression layer 15 prevents scattered light from being reflected in the central part 6c by the top surface of the second upper cladding layer 6b. The antireflection film constituting the second reflection suppression layer 15 is made of a dielectric. The dielectric material of the antireflection film may include a one material selected from a dielectric material group made of $SiO_2$, $Al_2O_3$, TiO, $Ta_2O_5$ and SiN or the like or include a material combining a plurality of materials from this dielectric material group.

Scattered light generated at the butt joint interface 11 passes through the second reflection suppression layer 15 and is emitted above the second upper cladding layer 6b. The scattered light that has passed does not reach the emission facet 12 and can thereby reduce optical noise coupled to the optical fiber. It is possible to provide angle dependency or wavelength dependency by devising the design of the antireflection film constituting the second reflection suppression layer 15. For example, when the semiconductor optical device 22 is modified so as to cause signals of a plurality of wavelengths to propagate, the second reflection suppression layer 15 may selectively transmit only light having a specific wavelength.

Embodiment 3.

Figure 8:
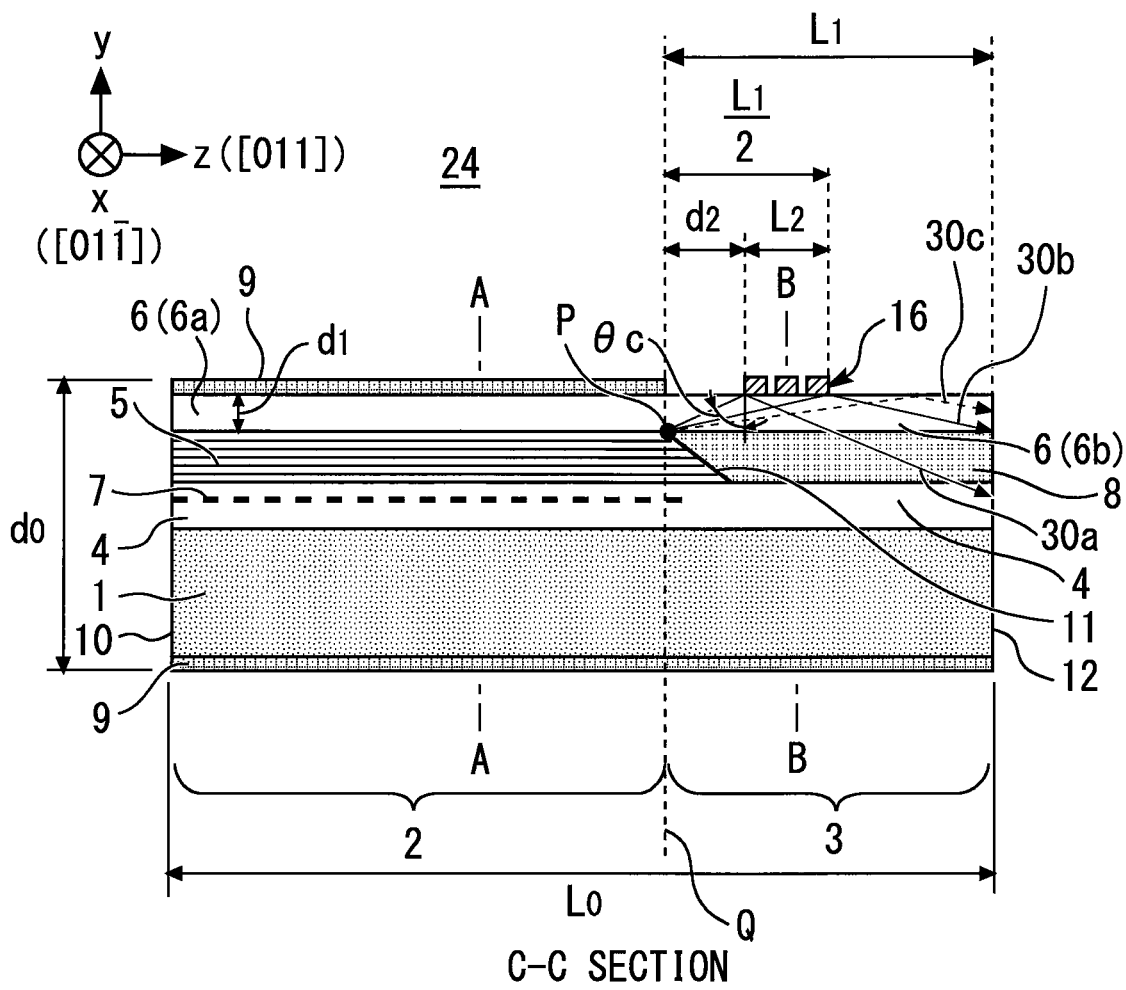
FIG. 8 is a cross-sectional view illustrating a semiconductor optical device according to Embodiment 3 of the present invention.

FIG. 8 is a cross-sectional view illustrating a semiconductor optical device 24 according to Embodiment 3 of the present invention. The first reflection suppression layer 13 of Embodiment 1 is replaced by a third reflection suppression layer 16. The third reflection suppression layer 16 according to Embodiment 3 is a diffraction grating. The third reflection suppression layer 16 diffracts light reaching the vicinity of the central part 6c on the top surface of the second upper cladding layer 6b.

The diffraction grating constituting the third reflection suppression layer 16 may be constructed of a semiconductor. The semiconductor material of the diffraction grating may be one semiconductor selected from a group made of InP, InGaAsP and Si. The diffraction grating constituting the third reflection suppression layer 16 may also be made of a dielectric. The dielectric material of the diffraction grating may be one dielectric selected from a group of $SiO_2$ and SiN.

The diffraction grating constituting the third reflection suppression layer 16 may also be a diffraction grating having a concavo-convex shape formed on the second upper cladding layer 6b or a diffraction grating including a plurality of grating pieces buried in the second upper cladding layer 6b.

Scattered light generated at the butt joint interface 11 is emitted by the third reflection suppression layer 16 to the outside of the chip. Thus, the scattered light does not reach the emission facet 12, and so it is possible to reduce optical noise coupled to the optical fiber. According to the third reflection suppression layer 16, it is possible to provide wavelength selectivity and angle selectivity by devising the structure of the diffraction grating in addition to effects similar to those of Embodiment 1. Since the third reflection suppression layer 16 is formed only partially instead of over the overall length of the optical waveguide section 3, it is possible to shorten an electron beam drawing time to form the diffraction grating.

REFERENCE SIGNS LIST

1 Semiconductor substrate
2 Laser section
3 Optical waveguide section
4 Lower cladding layer
5 Active layer
6 Upper cladding layer
6a First upper cladding layer
6b Second upper cladding layer
6c Central part
7 Diffraction grating
8 Core layer
9 Electrode
10 Rear facet
11 Butt joint interface
12 Emission facet
13 First reflection suppression layer
15 Second reflection suppression layer
16 Third reflection suppression layer
19 Buried layer
20,22,24 Semiconductor optical device
30a First light beam
30b Second light beam
30c Third light beam
$L_1$ Overall length of optical waveguide section
$L_2$ Length of First to Third reflection suppression layers
Q Virtual boundary line between laser section and optical waveguide section
$d_1$ Thickness of upper cladding layer
$d_2$ Predetermined distance
$\theta_C$ Total reflection critical angle

The invention claimed is:

1. A semiconductor optical device comprising:
a semiconductor substrate that has a length and width;
a laser section that is provided on the semiconductor substrate and comprises an active layer;
an optical waveguide section comprising a lower cladding layer laminated on the semiconductor substrate, a core layer laminated on the lower cladding layer and connected to an end portion of the active layer and an upper cladding layer laminated on the core layer, the optical waveguide section being provided on the semiconductor substrate adjacent to the laser section in a length direction; and
a reflection suppression layer that is provided either on a top surface of the upper cladding layer or above the core layer in the upper cladding layer, has a length shorter than an overall length of the optical waveguide section and is positioned at a center of the optical waveguide section in the length direction, wherein
the reflection suppression layer has one end provided on a side of the laser section and another end opposite to the one end, and
the one end of the reflection suppression layer is a predetermined distance away from a boundary between the laser section and the optical waveguide section in the length direction.

2. The semiconductor optical device according to claim 1, wherein $$d_2 \leq d_1 \times \tan \theta_C$$

where $d_1$ is a thickness of the upper cladding layer, $\theta_C$ is a total reflection critical angle of the upper cladding layer and $d_2$ is the predetermined distance.

3. A semiconductor optical device comprising:
a semiconductor substrate that has a length and width;
a laser section that is provided on the semiconductor substrate and comprises an active layer;
an optical waveguide section comprising a lower cladding layer laminated on the semiconductor substrate, a core layer laminated on the lower cladding layer and connected to an end portion of the active layer and an upper cladding layer laminated on the core layer, the optical waveguide section being provided on the semiconductor substrate adjacent to the laser section in a length direction; and
a reflection suppression layer that is provided either on a top surface of the upper cladding layer or above the core layer in the upper cladding layer, has a length shorter than an overall length of the optical waveguide section, wherein
the reflection suppression layer has one end provided on a side of the laser section and another end opposite to the one end, and
the one end of the reflection suppression layer is a predetermined distance away from a boundary between the laser section and the optical waveguide section in the length direction,
the optical waveguide section comprises an emission facet from which signal light is emitted,
the reflection suppression layer extends from a center of the optical waveguide section toward a side of the laser section in the length direction, and
the reflection suppression layer is not provided closer to a side of the emission facet than the center of the optical waveguide section in the length direction.

4. The semiconductor optical device according to claim 1, wherein the reflection suppression layer is a light absorption layer made of a material having a band gap equal to or less than the band gap of the active layer.

5. The semiconductor optical device according to claim 1, wherein the reflection suppression layer is an antireflection film that overlaps the top surface of the upper cladding layer.

6. The semiconductor optical device according to claim 1, wherein the reflection suppression layer is a diffraction grating that overlaps the top surface of the upper cladding layer.

7. The semiconductor optical device according to claim 3, wherein $$d_2 \leq d_1 \times \tan \theta_C$$

where $d_1$ is a thickness of the upper cladding layer, $\theta_C$ is a total reflection critical angle of the upper cladding layer and $d_2$ is the predetermined distance.

8. The semiconductor optical device according to claim 3, wherein the reflection suppression layer is a light absorption layer made of a material having a band gap equal to or less than the band gap of the active layer.

9. The semiconductor optical device according to claim 3, wherein the reflection suppression layer is an antireflection film that overlaps the top surface of the upper cladding layer.

10. The semiconductor optical device according to claim 3, wherein the reflection suppression layer is a diffraction grating that overlaps the top surface of the upper cladding layer.

* * * * *